(12) United States Patent
Lan

(10) Patent No.: US 12,270,839 B2
(45) Date of Patent: Apr. 8, 2025

(54) POWER CONSUMPTION EVALUATION DEVICE AND POWER CONSUMPTION EVALUATION METHOD

(71) Applicant: Nuvoton Technology Corporation, Hsinchu (TW)

(72) Inventor: Yung-Chi Lan, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 295 days.

(21) Appl. No.: 17/749,143

(22) Filed: May 20, 2022

(65) Prior Publication Data

US 2023/0314490 A1 Oct. 5, 2023

(30) Foreign Application Priority Data

Apr. 1, 2022 (TW) .................................. 111112714

(51) Int. Cl.
*G01R 21/133* (2006.01)
*G01R 19/25* (2006.01)

(52) U.S. Cl.
CPC ..... *G01R 21/1331* (2013.01); *G01R 19/2513* (2013.01); *G01R 21/1338* (2013.01)

(58) Field of Classification Search
CPC ............ G01R 21/1338; G01R 21/1331; G01R 19/2513; H01M 10/4285; H01M 10/48
USPC ....... 324/140, 500, 600, 764.01, 103 R, 771, 324/761.01, 501, 639, 642, 702, 76.11, 324/76.66, 96
See application file for complete search history.

(56) References Cited

U.S. PATENT DOCUMENTS

| 6,718,473 B1 * | 4/2004 | Mirov ..................... G06F 1/324 |
| | | 375/376 |
| 10,863,600 B2 * | 12/2020 | Greenwood ......... H05B 45/382 |
| 11,070,054 B2 * | 7/2021 | Ojika ........................ H02J 1/10 |
| 2009/0323374 A1 | 12/2009 | Park et al. |
| 2012/0026007 A1 * | 2/2012 | Beattie ..................... G01D 4/14 |
| | | 340/870.02 |
| 2013/0107585 A1 * | 5/2013 | Sims ................. H02M 3/33507 |
| | | 363/21.14 |

(Continued)

FOREIGN PATENT DOCUMENTS

| CN | 110011539 | 7/2019 |
| CN | 113300577 | 8/2021 |
| TW | 201432434 | 8/2014 |

OTHER PUBLICATIONS

"Office Action of Taiwan Counterpart Application", issued on Nov. 4, 2022, pp. 1-5.

*Primary Examiner* — Raul J Rios Russo
*Assistant Examiner* — Trung Q Nguyen
(74) *Attorney, Agent, or Firm* — JCIPRNET

(57) ABSTRACT

A power consumption evaluation device and a power consumption evaluation method are provided. The power consumption evaluation device includes a power converter, a counter, and a controller. The power converter includes a power switch. The power switch performs a switching operation according to a control signal, so that the power converter supplies power to a corresponding load among at least one load. The counter counts one of a positive pulse and a negative pulse of the control signal during a measurement period to obtain a count value. The controller generates an evaluation result of the corresponding load according to the count value.

20 Claims, 6 Drawing Sheets

(56) References Cited

U.S. PATENT DOCUMENTS

| | | | |
|---|---|---|---|
| 2014/0175885 A1* | 6/2014 | Shih | H02J 9/005 |
| | | | 307/31 |
| 2020/0076477 A1* | 3/2020 | Tramoni | H02M 7/06 |
| 2022/0104766 A1* | 4/2022 | Taylor | A61B 5/4866 |

* cited by examiner

POWER CONSUMPTION EVALUATION DEVICE AND POWER CONSUMPTION EVALUATION METHOD

CROSS-REFERENCE TO RELATED APPLICATION

This application claims the priority benefit of Taiwan application serial no. 111112714, filed on Apr. 1, 2022. The entirety of the above-mentioned patent application is hereby incorporated by reference herein and made a part of this specification.

BACKGROUND

Technical Field

The disclosure relates to the field of power consumption evaluation, and in particular to a power consumption evaluation device and a power consumption evaluation method.

Description of Related Art

An electronic device with low power consumption dynamically switches power modes of multiple functional circuit blocks according to a usage situation of a user. The circuit blocks that do not need to work enter a power saving mode, and the circuit blocks that are running are operated in a working mode. Therefore, in the design of the electronic device, the designer needs to evaluate the power consumption situations of the electronic device in different modes to design the different power modes of the electronic device.

Generally speaking, the conventional evaluation method requires at least one detection resistor to be coupled to the corresponding circuit block. When the load current of the circuit block flows through the detection resistor, the detection circuit evaluates or obtains the power consumption of the corresponding circuit block based on the voltage difference between the two ends of the detection resistor. The detection circuit amplifies the voltage difference between the two ends of the detection resistor, and generates a quantized digital signal through an analog-to-digital converter (ADC).

However, if the resistance value of the detection resistor is too small, the signal input into the ADC may be too small, resulting in insufficient accuracy. If the resistance value of the detection resistor is too large, the digital value of the ADC will be saturated. Therefore, in order to respond to multiple power modes of situations where the current range is relatively large, the detection resistor needs a circuit for dynamically adjusting the resistance value of the detection resistor. Therefore, the overall evaluation architecture becomes complex. In addition, the resistance value of the detection resistor is not accurate. When applied to multiple functional circuit blocks, the accuracy of the power consumption analysis of the functional circuit blocks is bound to be affected by the inaccuracy of the resistance values of multiple detection resistors.

SUMMARY

The disclosure provides a power consumption evaluation device and a power consumption evaluation method.

The power consumption evaluation device of the disclosure is configured to evaluate a power consumption of at least one load. The power consumption evaluation device includes a first power converter, a first counter, and a controller. The first power converter includes a first power switch. The first power switch performs a first switching operation according to a first control signal, so that the first power converter supplies power to a first load among the at least one load. The first counter is coupled to the first power converter. The first counter counts one of a positive pulse and a negative pulse of the first control signal during a measurement period to obtain a first count value. The controller is coupled to the first counter. The controller generates a first evaluation result according to the first count value. The first evaluation result is associated with a first power consumption of the first load during the measurement period. The first power consumption is proportional to first count value.

The power consumption evaluation method of the disclosure is configured to evaluate a power consumption of at least one load. The power consumption evaluation method includes the following steps. A first power converter is connected to a first load among the at least one load. A first switching operation is performed by a first power switch of the first power converter according to a first control signal, so that the first power converter supplies power to the first load. One of a positive pulse and a negative pulse of the first control signal is counted during a measurement period to obtain a first count value. A first evaluation result is generated according to the first count value. The first evaluation result is associated with a first power consumption of the first load during the measurement period. The first power consumption is proportional to the first count value.

Based on the above, in the power consumption evaluation device and the power consumption evaluation method of the disclosure, one of the positive pulse and the negative pulse of the control signal for controlling the power switch is counted to obtain the count value, and the evaluation result is generated according to the count value. The disclosure does not require the use of a detection resistor to generate the evaluation result. In this way, the overall evaluation architecture is simplified. In addition, the disclosure can also eliminate the influence caused by the inaccuracy of the detection resistor.

In order for the features and advantages of the disclosure to be more comprehensible, the following specific embodiments are described in detail in conjunction with the drawings.

DETAILED DESCRIPTION OF DISCLOSED EMBODIMENTS

Figure 1:
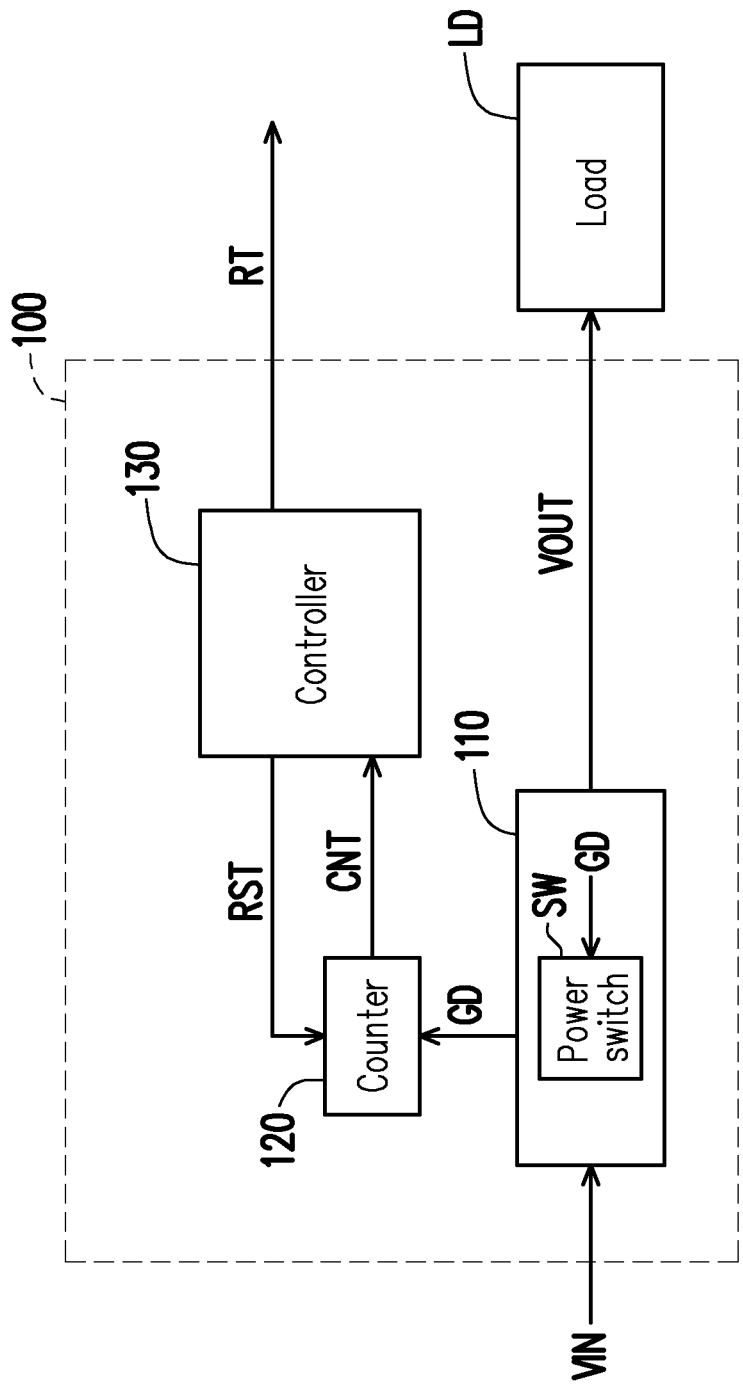
FIG. 1 is a schematic diagram of a power consumption evaluation device according to a first embodiment of the disclosure.

Some embodiments of the disclosure will be described in detail below with reference to the drawings. When the same reference numerals appear in different drawings, the reference numerals in the following description will be regarded as referring to the same or similar elements. The embodiments are only a part of the disclosure and do not disclose all possible implementations of the disclosure. More precisely, the embodiments are only examples within the protection scope of the disclosure.

Please refer to FIG. 1. FIG. 1 is a schematic diagram of a power consumption evaluation device according to a first embodiment of the disclosure. In the embodiment, a power consumption evaluation device 100 is configured to evaluate a power consumption of a load LD. The load LD may be one of multiple circuit blocks of an electronic device. The power consumption evaluation device 100 includes a power converter 110, a counter 120, and a controller 130. The power converter 110 includes a power switch SW. The power switch SW performs a switching operation according to a control signal GD, so that the power converter 110 supplies power to the load LD. In the embodiment, the power converter 110 converts an input power VIN to generate an output power VOUT. The power converter 110 may be a power conversion circuit with at least one power switch (also referred to as a switching power converter), such as a step-up converter, a step-down converter, a flyback converter, an LLC resonant converter, and an asymmetrical half bridge (AHB) converter.

In the embodiment, the counter 120 is coupled to the power converter 110. The counter 120 counts a positive pulse of the control signal GD during a measurement period to obtain a count value CNT. The controller 130 is coupled to the counter 120. The controller 130 generates an evaluation result RT according to the count value CNT. In the embodiment, the evaluation result RT is associated with the power consumption of the load LD during the measurement period. The evaluation result RT is, for example, a class interval of the power consumption of the load LD during the measurement period. The evaluation result RT is, for example, the actual power consumption of the load LD during the measurement period. The evaluation result RT is, for example, changes in power consumption of the load LD based on different modes during the measurement period. The power consumption is proportional to the count value CNT. In other words, the evaluation result RT is associated with the count value CNT. The evaluation result RT may be a data string or a data packet generated or exported by the controller 130. In some embodiments, the control signal GD includes a negative pulse. The counter 120 counts the negative pulse of the control signal GD during the measurement period to obtain the count value CNT.

In the embodiment, during the measurement period, the larger the count value CNT, the larger the power consumption of the load LD during the measurement period. Therefore, the controller 130 provides the evaluation result RT that the load LD has a relatively large power consumption. On the other hand, during the measurement period, the smaller the count value CNT, the smaller the power consumption of the load LD during the measurement period. Therefore, the controller 130 provides the evaluation result RT that the load LD has a relatively small power consumption.

It is worth mentioning here that the power consumption evaluation device 100 counts the positive pulse of the control signal GD controlling the power switch SW to obtain the count value CNT, and generates the evaluation result RT according to the count value CNT. The power consumption evaluation device 100 does not need to use a detection resistor to generate the evaluation result RT. In this way, the overall evaluation architecture is simplified. The power consumption evaluation device 100 can also eliminate the evaluation influence caused by the inaccuracy of the detection resistor.

In addition, the power consumption evaluation device 100 does not need to use the detection resistor. The power consumption evaluation device 100 does not cause additional power consumption of the detection resistor. Therefore, for the test evaluation of an electronic device with low power consumption, the power consumption evaluation device 100 will not affect or misjudge the evaluation result RT based on the additional power consumption.

In the embodiment, the controller 130 controls the counter 120 to start counting the positive pulse of the control signal GD when the measurement period starts. The controller 130 records the count value CNT when the measurement period ends, and provides the reset signal RST. The counter 120 resets the count value CNT stored in the counter 120 in response to the reset signal RST. At the start of the next measurement period, the controller 130 controls the counter 120 to start counting the positive pulse of the control signal GD again.

In the embodiment, the controller 130 receives a unit power consumption of the power converter 110 in response to the positive pulse, and calculates the power consumption of the load LD during the measurement period according to the count value CNT and the unit power consumption of the positive pulse.

For example, based on the design of the power converter 110, the unit power consumption of a single positive pulse can be known in advance. Therefore, the controller 130 multiplies the unit power consumption of the positive pulse and the count value CNT to obtain the power consumption of the load LD during the measurement period.

In the embodiment, the controller 130 is, for example, a central processing unit (CPU), other programmable general-purpose or specific-purpose microprocessor, digital signal processor (DSP), programmable controller, application specific integrated circuits (ASIC), programmable logic device (PLD), other similar devices, or a combination of the devices, which may load and execute a computer program.

Figure 2:
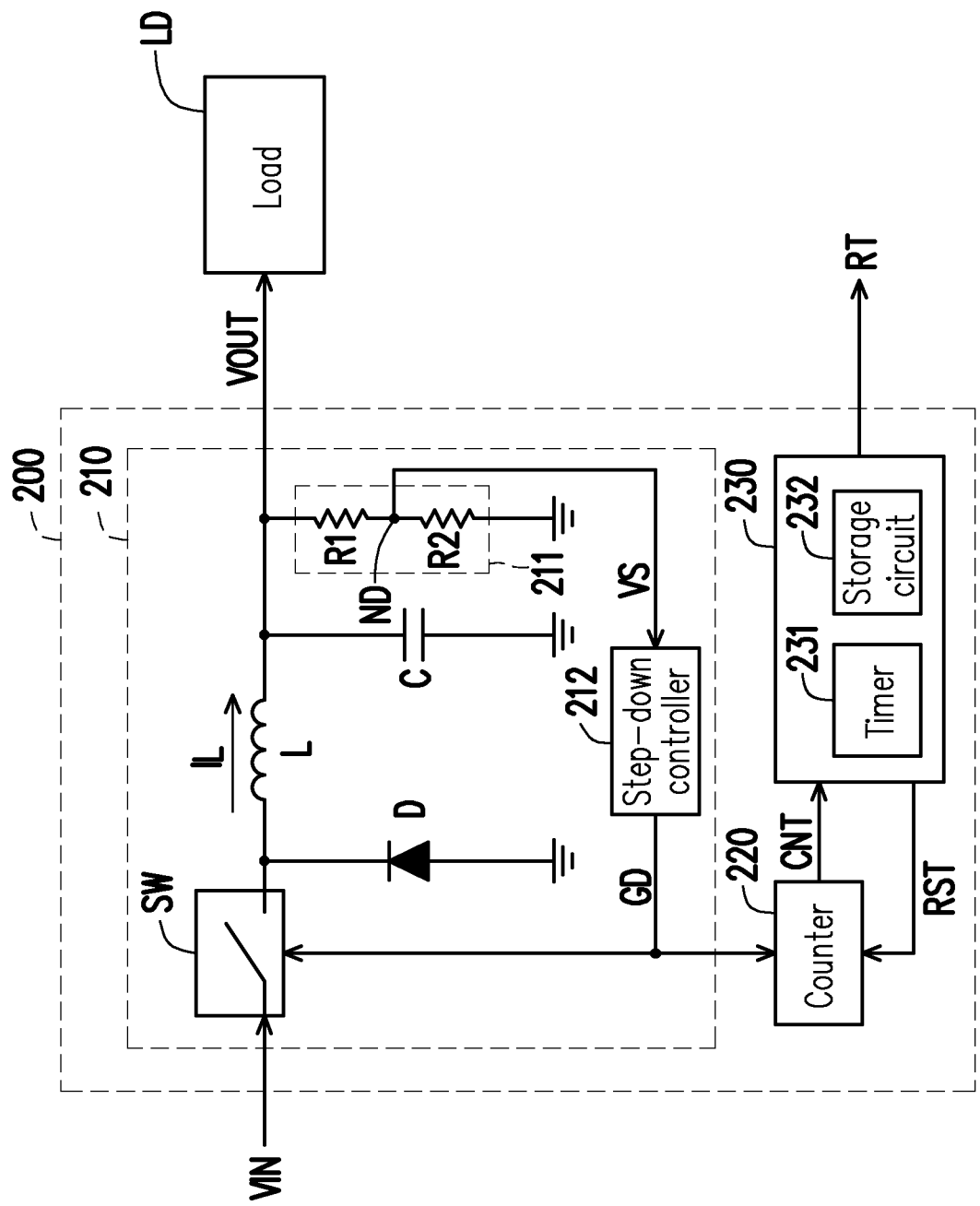
FIG. 2 is a schematic diagram of a power consumption evaluation device according to a second embodiment of the disclosure.
Figure 3:
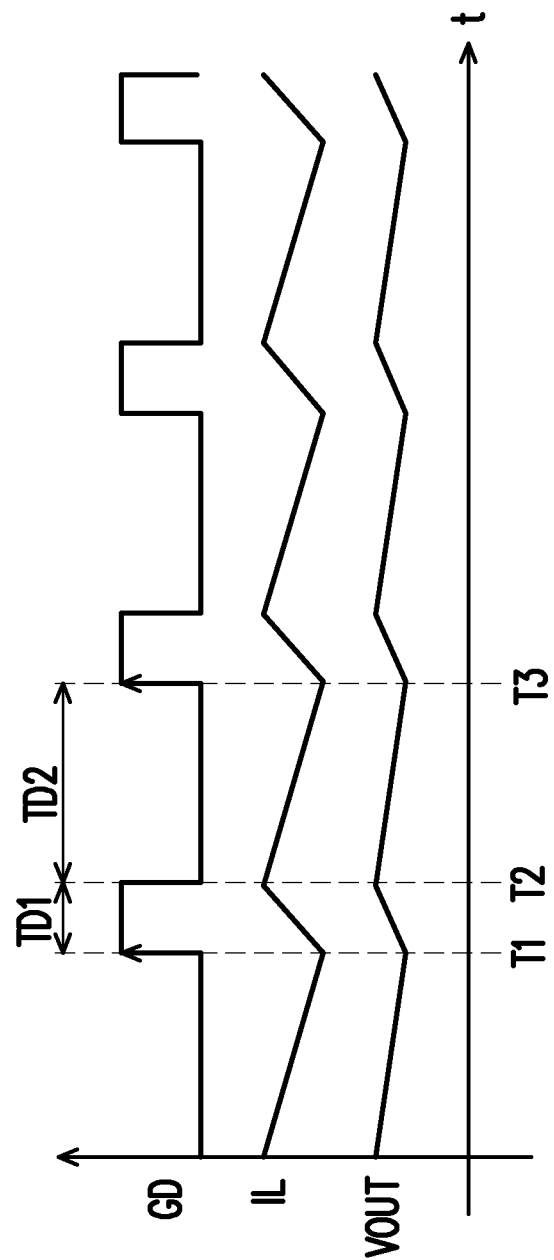
FIG. 3 is a signal timing diagram according to the second embodiment.

Please refer to FIG. 2 and FIG. 3 at the same time. FIG. 2 is a schematic diagram of a power consumption evaluation device according to a second embodiment of the disclosure. FIG. 3 is a signal timing diagram according to the second embodiment. In the embodiment, a power consumption evaluation device 200 includes a power converter 210, a counter 220, and a controller 230. The power converter 210 of the embodiment is exemplified by a step-down converter (but the disclosure is not limited thereto). The power converter 210 includes a power switch SW, an inductor L, a diode D, a capacitor C, a bleeder circuit 211, and a step-down controller 212. A first end of the power switch SW serves as an input end of the power converter 210. The first end of the power switch SW receives the input power VIN. A first end of the inductor L is coupled to a second end of the power switch SW. A second end of the inductor L serves as an output end of the power converter 210. A cathode of the diode D is coupled to the second end of the power switch SW. An anode of the diode D is coupled to a reference low voltage (for example, ground). The capacitor C is coupled between the second end of the inductor L and the reference low voltage. The bleeder circuit 211 is coupled between the second end of the inductor L and the reference low voltage. The bleeder circuit 211 divides a voltage value of the output power VOUT at the output end to generate a sensing voltage value VS associated with the output power VOUT.

The step-down controller 212 includes bleeder resistors R1 and R2. A first end of the bleeder resistor R1 is coupled to the output end. A second end of the bleeder resistor R1 is coupled to a bleeder node ND. A first end of the bleeder resistor R2 is coupled to the bleeder node ND. A second end of the bleeder resistor R2 is coupled to a reference ground end. The step-down controller 212 divides the voltage value of the output power VOUT according to the resistance values of the bleeder resistors R1 and R2 to generate the sensing voltage value VS at the bleeder node ND. Therefore, the sensing voltage value VS is proportional to the voltage value of the output power VOUT.

In the embodiment, the step-down controller 212 is coupled to the bleeder circuit 211 and a control end of the power switch SW. The step-down controller 212 receives the sensing voltage value VS from the bleeder circuit 211, and provides the control signal GD according to changes in the sensing voltage value VS, thereby controlling the power switch SW to be turned on or off.

At a time point T1, when the sensing voltage value VS drops to a preset low voltage, it means that the output power VOUT drops to a voltage level. The control signal GD transitions from a low voltage level to a high voltage level. Therefore, the power switch SW is turned on to transmit the input power VIN. The inductor L is charged. After the power switch SW is turned on, an inductor current value IL at the inductor L is increased. The voltage value of the output power VOUT is also increased. At a time point T2, the control signal GD transitions from the high voltage level to the low voltage level. Therefore, the power switch SW is turned off to stop receiving the input power VIN. The inductor L is discharged. After the power switch SW is turned off, the inductor current value IL at the inductor L gradually decreases. The output power VOUT also gradually decreases. When the sensing voltage value VS drops to the preset low voltage again at a time point T3, the control signal GD transitions from the low voltage level to the high voltage level again.

In the embodiment, the counter 220 is coupled to the step-down controller 212 to receive the control signal GD. The counter 220 counts the positive pulse of the control signal GD during the measurement period to obtain the count value CNT. Taking the embodiment as an example, at the time point T1, the counter 220 is triggered in response to a rising edge of the control signal GD, thereby incrementing the count value CNT. At the time point T3, the counter 220 is triggered again in response to the rising edge of the control signal GD to increment the count value CNT.

In some embodiments, the counter 220 is triggered in response to a falling edge of the control signal GD to increment the count value CNT. In some embodiments, the counter 220 is triggered in response to a waveform of the positive pulse of the control signal GD to increment the count value CNT.

The controller 230 includes a timer 231 and a storage circuit 232. For example, the controller 230 may receive an external operation signal (not shown) to know the start of the measurement period. Therefore, when the measurement period starts, the timer 231 starts to count an operation time length. At the same time, the controller 230 controls the counter 220 to start counting the positive pulse of the control signal GD. When the operation time length reaches the time length of the measurement period, the controller 230 provides the count value CNT recorded from the counter 220, and then provides the reset signal RST to the counter 220. The counter 220 resets the count value CNT of the counter 220 itself in response to the reset signal RST. In the embodiment, the measurement period may be adjusted. The measurement period is, for example, seconds, minutes, or hours. In the embodiment, the controller 230 further includes the storage circuit 232 for storing the count value CNT. The storage circuit 232 may be a memory circuit well known to persons skilled in the art.

In the embodiment, the control signal GD is provided based on pulse frequency modulation (PFM). In a case of light load and a case of heavy load, a time interval TD1 between the time point T1 and the time point T2 remains substantially unchanged. In the case of heavy load, a time interval TD2 between the time point T2 and the time point T3 is shorter. In other words, in the case of heavy load, a time difference between two adjacent positive pulses is shorter. Therefore, the positive pulses occur more frequently. In the case of light load, the time interval TD2 between the time point T2 and the time point T3 is longer. In other words, in the case of light load, a time difference between two adjacent positive pulses is longer. Therefore, the positive pulses occur less frequently. It can be seen that based on the same measurement period, the number of positive pulses of the control signal GD in the case of heavy load is larger, and the higher the count value CNT, the higher the power consumption. The number of positive pulses of the control signal GD in the case of light loads is smaller, and the lower the count value CNT, the lower the power consumption. Therefore, the controller 230 can use the number of positive pulses to evaluate the power consumption of the load LD, thereby generating the evaluation result RT.

In some embodiments, the control signal GD is provided based on pulse width modulation (PWM). In the case of light load and the case of heavy load, the time interval between time point T1 and time point T3 remains substantially unchanged. The time interval TD1 changes due to changes in the load. For example, in the case of light load, the time period TD1 during which the control signal GD is in the positive pulse is shorter. In the case of heavy load, the time interval TD1 during which the control signal GD is in the positive pulse is longer. Therefore, in the embodiments, the counter 220 counts the time length of the time interval TD1 based on a unit time length (for example, a single cycle of the clock) to obtain the count value CNT. The controller 230 can use the count value CNT to evaluate the power consumption of the load LD, thereby generating the evaluation result RT.

Besides, since the time interval TD1 between the time point T1 and the time point T2 remains substantially unchanged, the power consumption in a single time interval TD1 can be known in advance. The controller 230 can multiply the power consumption of the single time interval TD1 by the count value CNT to obtain the power consumption of the load LD during the measurement period.

It is worth mentioning here that once the measurement period ends, the controller 230 can multiply the power consumption of the single time interval TD1 by the count value CNT to obtain the power consumption of the load LD during the measurement period. The controller 230 has a faster response speed. In this way, the power consumption evaluation device 200 does not need to use an additional detection resistor and analog-to-digital converter to obtain the power consumption of the load LD during the measurement period.

Figure 4:
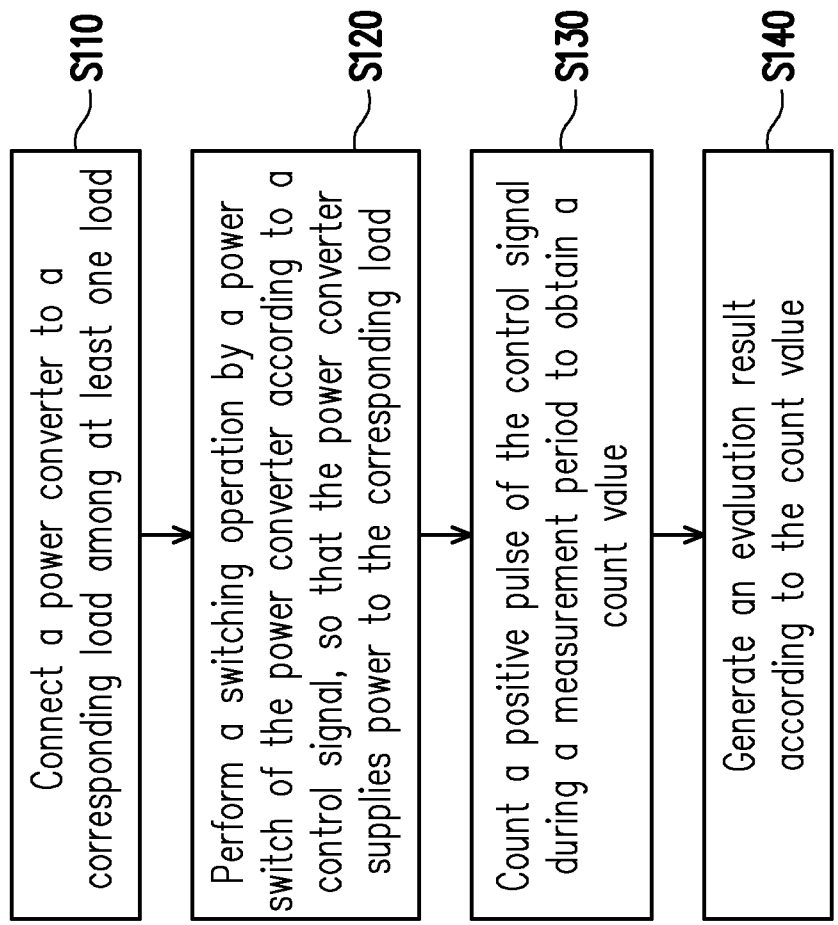
FIG. 4 is a method flowchart of a power consumption evaluation method according to the first embodiment of the disclosure.

Please refer to FIG. 1 and FIG. 4 at the same time. FIG. 4 is a method flowchart of a power consumption evaluation method according to the first embodiment of the disclosure. In the embodiment, the power consumption evaluation method is applicable to the power consumption evaluation device 100. In Step S110, the power converter 110 is connected to the load LD among the at least one load. In Step S120, the power switch SW of the power converter 110 performs the switching operation according to the control signal GD, so that the power converter 110 supplies power to the load LD. In Step S130, during the measurement period, the positive pulse of the control signal GD is counted to obtain the count value CNT. The operation of Step S130 is, for example, executed by the counter 120. In Step S140, the evaluation result RT is generated according to the count value CNT. The operation of Step S140 is, for example executed by the controller 130.

In the embodiment, the power consumption evaluation method is also applicable to the power consumption evaluation device 200. The implementation details of Steps S110 to S140 may be sufficiently taught in the various embodiments of FIG. 1 to FIG. 3, so there will be no repetition.

Figure 5:
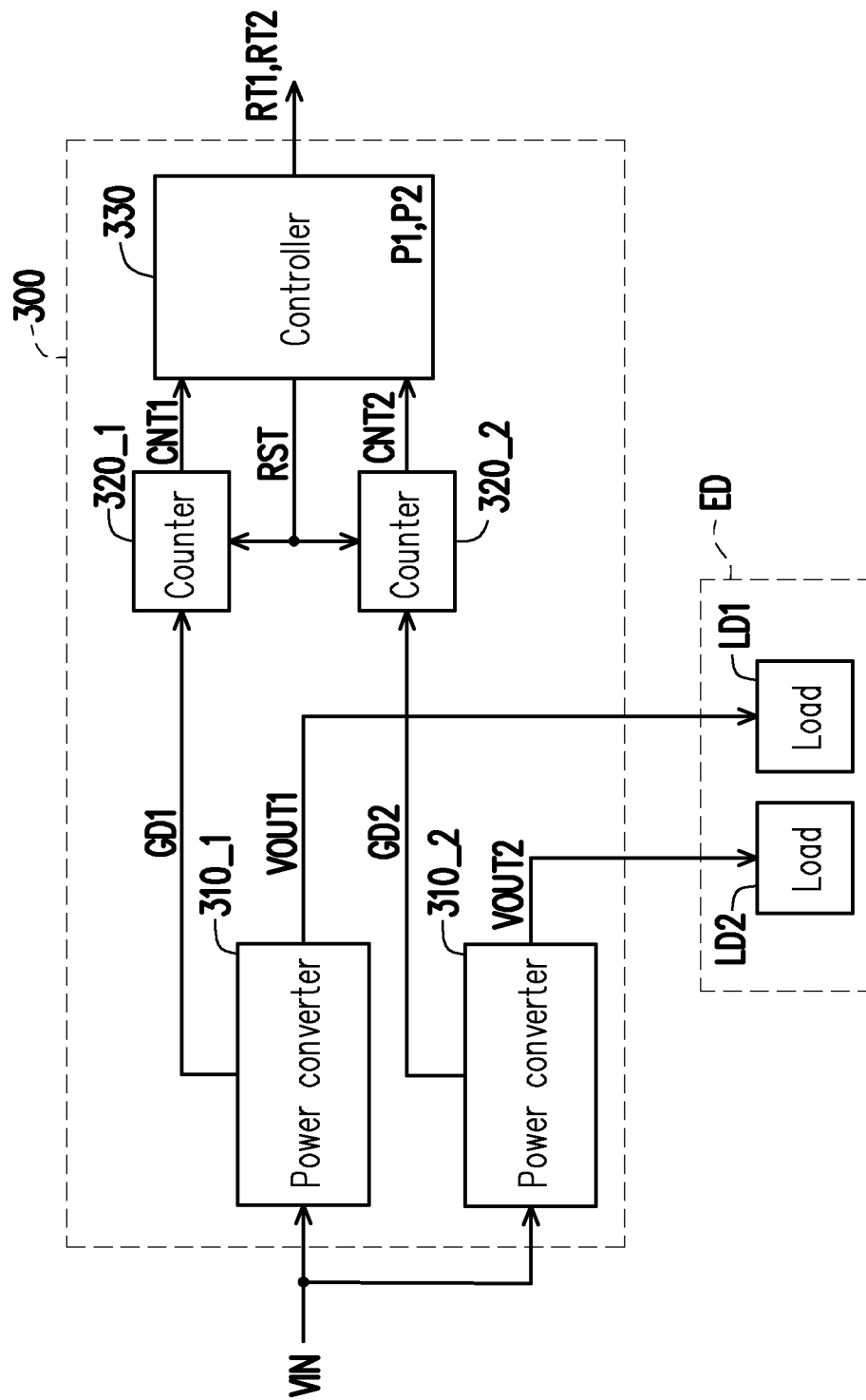
FIG. 5 is a schematic diagram of a power consumption evaluation device according to a third embodiment of the disclosure.

Please refer to FIG. 5. FIG. 5 is a schematic diagram of a power consumption evaluation device according to a third embodiment of the disclosure. In the embodiment, a power consumption evaluation device 300 is configured to evaluate multiple loads. For convenience of description, the embodiment takes two loads LD1 and LD2 as an example. In the embodiment, the loads LD1 and LD2 are respectively different circuit blocks in an electronic device ED. In the embodiment, the power consumption evaluation device 300 includes power converters 310_1 and 310_2, counters 320_1 and 320_2, and a controller 330. The power converters 310_1 and 310_2 are correspondingly coupled to the loads LD1 and LD2. The power converters 310_1 and 310_2 respectively receive the input power VIN.

The power converter 310_1 converts the input power VIN based on a control signal GD1 to generate an output power VOUT1. The power converter 310_1 uses the output power VOUT1 to supply power to the load LD1. The counter 320_1 is coupled to the power converter 310_1 and the controller 330. The counter 320_1 receives the control signal GD1, and counts a positive pulse of the control signal GD1 during the measurement period to obtain the count value CNT1.

The power converter 310_2 converts the input power VIN based on a control signal GD2 to generate an output power VOUT2. The power converter 310_2 uses the output power VOUT2 to supply power to the load LD2. The counter 320_2 is coupled to the power converter 310_2 and the controller 330. The counter 320_2 receives the control signal GD2 and counts a positive pulse of the control signal GD2 during the measurement period to obtain the count value CNT2.

In the embodiment, when the measurement period starts, the controller 330 controls the counter 320_1 to start counting the positive pulse of the control signal GD1, and controls the counter 320_2 to start counting the positive pulse of the control signal GD2.

When the measurement period ends, the controller 330 receives the count values CNT1 and CNT2, and provides the reset signal RST to the counters 320_1 and 320_2. The counter 320_1 resets its own count value CNT1 in response to the reset signal RST. The counter 320_2 resets its own count value CNT2 in response to the reset signal RST. The controller 330 generates an evaluation result RT1 according to the received count value CNT1. The evaluation result RT1 is associated with a power consumption P1 of the load LD1 during the measurement period. The power consumption P1 is proportional to the count value CNT1. The controller 330 generates an evaluation result RT2 according to the received count value CNT2. The evaluation result RT2 is associated with a power consumption P2 of the load LD2 during the measurement period. The power consumption P2 is proportional to the count value CNT2.

In the embodiment, the controller 330 receives a unit power consumption of the power converter 310_1 in response to a single positive pulse of the control signal GD1. The controller 330 calculates the power consumption P1 of the load LD1 during the measurement period according to the count value CNT1 and the unit power consumption. For example, the controller 330 multiplies the unit power consumption of the positive pulse of the control signal GD1 and the count value CNT1 to obtain the power consumption P1. Similarly, the controller 330 also receives a unit power consumption of the power converter 310_2 in response to a single positive pulse of the control signal GD2, and calculates the power consumption P2 of the load LD2 during the measurement period according to the count value CNT2 and the unit power consumption. For example, the controller 330 multiplies the unit power consumption of the positive pulse of the control signal GD2 and the count value CNT2 to obtain the power consumption P2.

In addition, the controller 330 also obtains a power consumption ratio between the loads LD1 and LD2 according to the count values CNT1 and CNT2. For example, the power converters 310_1 and 310_2 are power converters with the same design. Therefore, the positive pulses of the control signals GD1 and GD2 are the same. When the count value CNT1 received by the controller 330 is 4 times the count value CNT2, the power consumption P1 of the load LD1 during the measurement period is 4 times the power consumption P2 of the load LD2 during the measurement period.

It should be noted that the embodiment eliminates the evaluation influence caused by the inaccuracy of the detection resistor. Therefore, the controller 330 can provide an accurate power consumption ratio.

Figure 6:
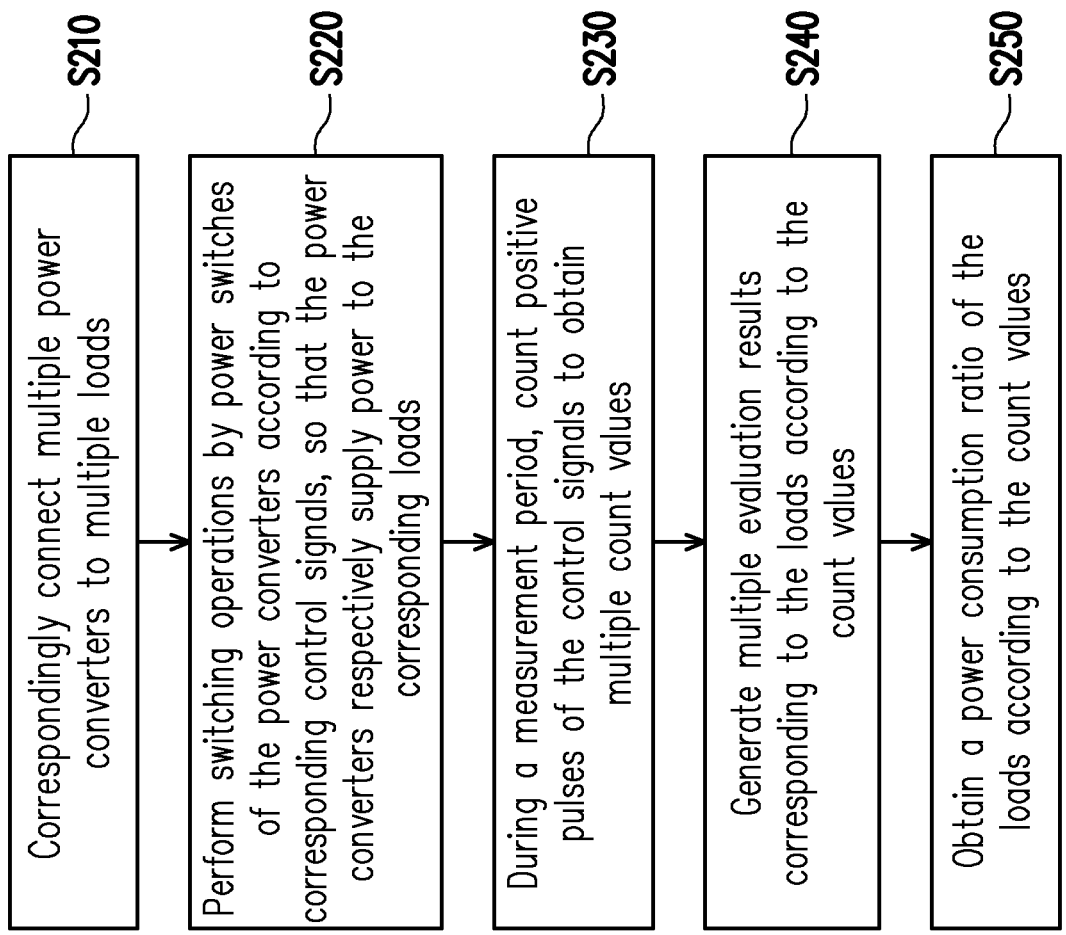
FIG. 6 is a method flowchart of a power consumption evaluation method according to the third embodiment of the disclosure.

Please refer to FIG. 5 and FIG. 6 at the same time. FIG. 6 is a method flowchart of a power consumption evaluation method according to the third embodiment of the disclosure. In the embodiment, the power consumption evaluation method is applicable to, for example, the power consumption evaluation device 300. In Step S210, the power converters 310_1 and 310_2 are respectively connected to the corresponding loads. Taking the embodiment as an example, the power converter 310_1 is connected to the load LD1. The power converter 310_2 is connected to the load LD2.

In Step S220, power switches of the power converters 310_1 and 310_2 perform switching operations according to the corresponding control signals GD1 and GD2, so that the power converters 310_1 and 310_2 respectively supply power to the corresponding loads. Taking the embodiment as an example, the power switch of the power converter 310_1 performs the switching operation according to the control signal GD1, so that the power converter 310_1 supplies power to the load LD1. The power switch of the power converter 310_2 performs the switching operation according to the control signal GD2, so that the power converter 310_2 supplies power to the load LD2.

In Step S230, during the measurement period, the positive pulses of the control signals GD1 and GD2 are counted to obtain the count values CNT1 and CNT2. Taking the embodiment as an example, the counter 320_1 counts the positive pulse of the control signal GD1 to obtain the count value CNT1. The counter 320_2 counts the positive pulse of the control signal GD2 to obtain the count value CNT2.

In Step S240, the evaluation results RT1 and RT2 are respectively generated according to the count values CNT1 and CNT2. Taking the embodiment as an example, the controller 330 generates the evaluation result RT1 of the load LD1 according to the count value CNT1. The controller 330 generates the evaluation result RT2 of the load LD2 according to the count value CNT2.

In Step S250, the power consumption ratio of the loads LD1 and LD2 is obtained according to the count values CNT1 and CNT2. Taking the embodiment as an example, the controller 330 can use only the count values CNT1 and CNT2 to know the power consumption ratio or a power consumption relationship of the loads LD1 and LD2 during the measurement period.

In some embodiments, the power consumption evaluation method may not execute Step S250. In some embodiments, Step S240 may be later than Step S250.

In summary, in the disclosure, one of the positive pulse and the negative pulse of the control signal for controlling the power switch is counted to obtain the count value, and the evaluation result is generated according to the count value. The disclosure does not require the use of a detection resistor to generate the evaluation result. In this way, the overall evaluation architecture is simplified. In addition, the disclosure can also eliminate the influence caused by the inaccuracy of the detection resistor. Therefore, in this way, the disclosure can provide an accurate power consumption ratio.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A power consumption evaluation device, configured to evaluate a power consumption of at least one load, the power consumption evaluation device comprising:
   a first power converter, comprising a first power switch, wherein the first power switch performs a first switching operation according to a first control signal, so that the first power converter supplies power to a first load among the at least one load;
   a first counter, directly coupled to the first power converter and configured to receive the first control signal directly outputted from the first power converter, wherein the first counter is further configured to count one of a positive pulse and a negative pulse of the first control signal during a measurement period to obtain a first count value; and
   a controller, directly coupled to the first counter and configured to receive the first count value directly outputted from the first counter, wherein the controller is further configured to generate a first evaluation result according to the first count value, wherein the first evaluation result is associated with a first power consumption of the first load during the measurement period, wherein the first power consumption is proportional to the first count value.

2. The power consumption evaluation device according to claim 1, wherein the controller records the first count value when the measurement period ends, and provides a reset signal to reset the first count value stored in the first counter.

3. The power consumption evaluation device according to claim 1, wherein the controller controls the first counter to start counting one of the positive pulse and the negative pulse of the first control signal when the measurement period starts.

4. The power consumption evaluation device according to claim 1, wherein the first counter is triggered in response to a rising edge of the first control signal, thereby incrementing the first count value.

5. The power consumption evaluation device according to claim 1, wherein the controller receives a unit power consumption of the first power converter in response to one of the positive pulse and the negative pulse, and calculates the first power consumption according to the first count value and the unit power consumption of one of the positive pulse and the negative pulse.

6. The power consumption evaluation device according to claim 5, wherein the controller multiplies the unit power consumption of one of the positive pulse and the negative pulse and the first count value to obtain the first power consumption.

7. The power consumption evaluation device according to claim 1, wherein the controller comprises:
   a storage circuit, configured to store the first count value.

8. The power consumption evaluation device according to claim 1, further comprising:
   a second power converter, comprising a second power switch, wherein the second power switch performs a second switching operation according to a second control signal, so that the second power converter supplies power to a second load among the at least one load; and
   a second counter, coupled to the second power converter and the controller, and configured to count one of a positive pulse and a negative pulse of the second control signal during a measurement period to obtain a second count value.

9. The power consumption evaluation device according to claim 8, wherein the controller receives a unit power consumption of the second power converter in response to one of the positive pulse and the negative pulse, and calculates the second power consumption according to the second count value and the unit power consumption of the one of the positive pulse and the negative pulse.

10. The power consumption evaluation device according to claim 9, wherein the controller multiplies the unit power consumption of the one of the positive pulse and the negative pulse and the second count value to obtain the second power consumption.

11. The power consumption evaluation device according to claim 8, wherein the controller obtains a power consumption ratio between the first load and the second load according to the first count value and the second count value.

12. A power consumption evaluation method, configured to evaluate a power consumption of at least one load, the power consumption evaluating method comprising:
   connecting a first power converter to a first load among the at least one load;
   performing a first switching operation by a first power switch of the first power converter according to a first control signal, so that the first power converter supplies power to the first load;
   using a first counter to count one of a positive pulse and a negative pulse of the first control signal during a measurement period to obtain a first count value, wherein the first counter is directly coupled to the first power converter, and the first counter is configured to receive the first control signal directly outputted from the first power converter; and
   using a controller to generate a first evaluation result according to the first count value, wherein the controller is directly coupled to the first counter, and the controller is configured to receive the first count value directly outputted from the first counter, wherein the first evaluation result is associated with a first power consumption of the first load during the measurement period, wherein the first power consumption is proportional to the first count value.

13. The power consumption evaluation method according to claim 12, further comprising:
recording the first count value when the measurement period ends, and providing a reset signal to reset the first count value.

14. The power consumption evaluation method according to claim 12, further comprising:
counting of one of the positive pulse and the negative pulse of the first control signal begins when the measurement period starts.

15. The power consumption evaluation method according to claim 12, further comprising:
triggering the first counter in response to a rising edge of the first control signal, thereby incrementing the first count value.

16. The power consumption evaluation method according to claim 12, further comprising:
receiving a unit power consumption of the first power converter in response to one of the positive pulse and the negative pulse; and
calculating the first power consumption according to the first count value and the unit power consumption of the one of the positive pulse and the negative pulse.

17. The power consumption evaluation method according to claim 16, wherein the step of calculating the first power consumption according to the first count value and the unit power consumption of the one of the positive pulse and the negative pulse comprises:
multiplying the unit power consumption of the one of the positive pulse and the negative pulse and the first count value to obtain the first power consumption.

18. The power consumption evaluation method according to claim 12, further comprising:
connecting a second power converter to a second load among the at least one load;
performing a second switching operation by a second power switch of the second power converter according to a second control signal, so that the second power converter supplies power to the second load among the at least one load;
counting one of the positive pulse and the negative pulse of the second control signal during a measurement period to obtain a second count value; and
generating a second evaluation result according to the second count value, wherein the second evaluation result is associated with a second power consumption of the second load during the measurement period, wherein the second power consumption is proportional to the second count value.

19. The power consumption evaluation method according to claim 18, further comprising:
receiving a unit power consumption of the second power converter in response to the one of the positive pulse and the negative pulse; and
calculating the second power consumption according to the second count value and the unit power consumption of the one of the positive pulse and the negative pulse.

20. The power consumption evaluation method according to claim 18, further comprising:
obtaining a power consumption ratio between the first load and the second load according to the first count value and the second count value.

* * * * *